United States Patent [19]
Yang et al.

[11] Patent Number: 5,730,808
[45] Date of Patent: Mar. 24, 1998

[54] PRODUCING SOLAR CELLS BY SURFACE PREPARATION FOR ACCELERATED NUCLEATION OF MICROCRYSTALLINE SILICON ON HETEROGENEOUS SUBSTRATES

[75] Inventors: Liyou Yang, Plainsboro, N.J.; Liangfan Chen, Langhorne, Pa.

[73] Assignee: Amoco/Enron Solar, Newtown, Pa.

[21] Appl. No.: 672,110

[22] Filed: Jun. 27, 1996

[51] Int. Cl.$^6$ .................. H01L 31/075; H01L 31/20
[52] U.S. Cl. .................. 136/249; 136/258; 257/440; 257/458; 438/74; 438/96; 438/97; 438/485
[58] Field of Search .................. 437/4, 108–109, 437/113; 136/249 TJ, 258 AM; 438/74, 96–97, 485; 257/458, 440

[56] References Cited

U.S. PATENT DOCUMENTS 5,246,506  9/1993  Arya et al. .................. 136/249
5,336,623  8/1994  Sichanogrist et al. .................. 437/4
5,403,404  4/1995  Arya et al. .................. 136/249 TJ

FOREIGN PATENT DOCUMENTS 62-90983  4/1987  Japan .................. 136/249 TJ

*Primary Examiner*—Aaron Weisstuch
*Attorney, Agent, or Firm*—Thomas W. Toplin

[57] ABSTRACT

Attractive multi-junction solar cells and single junction solar cells with excellent conversion efficiency can be produced with a microcrystalline tunnel junction, microcrystalline recombination junction or one or more microcrystalline doped layers by special plasma deposition processes which includes plasma etching with only hydrogen or other specified etchants to enhance microcrystalline growth followed by microcrystalline nucleation with a doped hydrogen-diluted feedstock.

50 Claims, 2 Drawing Sheets

PRODUCING SOLAR CELLS BY SURFACE PREPARATION FOR ACCELERATED NUCLEATION OF MICROCRYSTALLINE SILICON ON HETEROGENEOUS SUBSTRATES

The government of the United States of America may have rights to this invention pursuant to NREL Subcontract No. ZM-0-19033-1.

BACKGROUND OF THE INVENTION

This invention pertains to solar cells, and more particularly to a plasma deposition process for producing solar cells with a microcrystalline layer.

Solar cells and other photovoltaic devices convert solar radiation and other light into usable electrical energy. The energy conversion occurs as the result of the photovoltaic effect. Solar radiation (sunlight) impinging on a photovoltaic device and absorbed by an active region of semi-conductor material, e.g. an intrinsic i-layer of amorphous silicon, generates electron-hole pairs in the active region. The electrons and holes are separated by an electric field of a junction in the photovoltaic device. The separation of the electrons and holes by the junction results in the generation of an electric current and voltage. The electrons flow toward the region of the semiconductor material having an n-type conductivity. The holes flow toward the region of the semiconductor material having a p-type conductivity. Current will flow through an external circuit connecting the n-type region to the p-type region as long as light continues to generate electron-hole pairs in the photovoltaic device.

Single-junction devices comprise three layers. These are p- and n-layers which are extrinsic or doped and an i-layer which is intrinsic or undoped (at least containing no intentional doping). The i-layer is much thicker than the doped layers. This is because mainly light absorbed in the i-layer is converted to electrical power which can be used in an external circuit. The thickness of the i-layer (sometimes called the absorber layer) determines how much light is absorbed. When a photon of light is absorbed in the i-layer it gives rise to a unit of electrical current (an electron-hole pair). However, this electrical current will go nowhere on its own. Hence, the p- and n-layers. These layers, which contain charged dopant ions, set up a strong electric field across the i-layer. It is this electric field which draws the electric charge out of the i-layer and sends it through an external circuit where it can do work (e.g. power a light bulb).

Solar cells can be single junction or multi-junction cells. A multi-junction or tandem cell can be simply a stack of single junction p-i-n cells. There are two advantages to tandem cells; the first is light absorption. The different amorphous alloys absorb different parts of the solar spectrum. Amorphous silicon carbon (a-SiC) absorbs ultraviolet (UV) light efficiently while passing most visible and all infrared light. Amorphous silicon (a-Si) absorbs UV light (but not as efficiently as a-SiC), absorbs visible light efficiently, but does not absorb much infrared (IR) light. Amorphous silicon germanium (a-SiGe) absorbs IR efficiently and UV and visible light generally inefficiently. One benefit of tandem solar cells is that each layer (junction) can have a different absorbing layer, so that virtually all wavelengths of light can be absorbed efficiently. A second benefit of tandem cells is that because the absorbing layers are tailored to the solar spectrum and absorb light efficiently, they can be thinner. Thinner layers are more stable with respect to the Staebler-Wronski effect.

An amorphous silicon solar cell is comprised of a body of hydrogenated amorphous silicon (a-Si:H) material, which can be formed in a glow discharge of silane. Such cells can be of the type described in U.S. Pat. No. 4,064,521 entitled "Semiconductor Device Having A Body Of Amorphous Silicon," which issued to David E. Carlson on Dec. 20, 1977. Within the body of the cell there is an electric field which results from the different conductivity types of the semiconductor regions comprising the body.

Amorphous silicon solar cells are often fabricated by the glow discharge of silane ($SiH_4$). The process of glow discharge involves the discharge of energy through a gas at relatively low pressure and high temperature in a partially evacuated chamber. A typical process for fabricating an amorphous silicon solar cell comprises placing a substrate on a heated element within a vacuum chamber. A screen electrode, or grid, is connected to one terminal of a power supply, and a second electrode is connected to the substrate. While silane, at low pressure, is admitted into the vacuum chamber, a glow discharge is established between the two electrodes and an amorphous silicon film deposits upon the substrate.

Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Angstroms (Å), the diborane flow is stopped to form an intrinsic region having a thickness on the order of a few 1000 Angstroms. Thereafter, an n-type dopant, such as phosphine ($PH_3$), is added to the silane flow in order to form an n-type amorphous silicon layer having a thickness of a few 100 Angstroms. On the n-type layer, a transparent, conductive layer is formed. Zinc oxide (ZnO) can be used to form the transparent conductive layer.

Amorphous hydrogenated silicon (a-Si:H) based solar cell technology is currently the leading candidate for large-area, low-cost photovoltaic applications. The basic device structure is a single p-i-n junction or an n-i-p junction in which all layers are traditionally amorphous and are made in a continuous plasma deposition process.

The substrate of the solar cell can be made of glass or a metal, such as aluminum, nibium, titanium, chromium, iron, bismuth, antimony or steel. If a glass substrate is used, a transparent, conductive coating, such as tin oxide ($SnO_2$) can be applied to the glass substrate prior to forming the amorphous silicon. A metallic contact can be formed on the back of the substrate.

Current output of a photovoltaic device is maximized by increasing the total number of photons of differing energy and wavelength which are absorbed by the semiconductor material. The solar spectrum roughly spans the region of wavelength from about 300 nanometers to about 2200 nanometers, which corresponds to from about 4.2 eV to about 0.59 eV, respectively. The portion of the solar spectrum which is absorbed by the photovoltaic device is determined by the size of the bandgap energy of the semiconductor material. Crystalline silicon (c-Si) has a bandgap energy of about 1.1 eV. Solar radiation (sunlight) having an energy less than the bandgap energy is not absorbed by the semiconductor material and, therefore, does not contribute to the generation of electricity (current and voltage) of the photovoltaic device.

In order to obtain better utilization of the solar spectrum and to improve stability, two or more p-i-n junctions consisting of i-layer materials of different bandgaps can be built in series to form a monolithic multi-junction solar cell. The interface between the two junctions, often called the tunnel junction or recombination junction, is important to the performance of the photovoltaic device.

The doped layers in the device play a key role in building up the strong internal electric field across the i-layer, which is the predominant force in collecting photocarriers generated in the i-layer. In particular, the doped layers in the recombination junction of a multi-junction solar cell have to support large electric fields extending into the intrinsic layers, in addition to the high field in the recombination junction itself. The interface region must promote efficient recombination of electrons, generated in the first i-layer, with holes from the second i-layer. Also, the tunnel junction layers should provide minimal optical absorption. However, the electrical properties of amorphous doped layers are relatively poor as compared to their crystalline counterparts. For instance, the conductivities are typically only $\sim 1 \times 10^{-6}$ $(\Omega cm)^{-1}$ for a-Si:H p-layer and $\sim 1 \times 10^{-4} (\Omega cm)^{-1}$ for the n-layer. This is due partly to the low carrier mobilities in a-Si:H and partly to the low doping efficiencies in the disordered material. Moreover, the extremely high densities of tail states in amorphous materials prevent the Fermi levels from being too close to the band edges. The typical conductivity activation energies for a-Si:H p-layers and n-layers are ~0.4 eV and ~0.2 eV, respectively, thereby limiting the open circuit voltage of the a-SH solar cells to ~0.9 V given its bandgap of ~1.75 eV.

Doped microcrystalline silicon (μcSi) represents a very attractive alternative for a-Si:H based solar cells not only because of its much improved electrical and optical properties but also its compatibility with the low temperature PECVD process.

The use of microcrystalline silicon in the doped layers of the recombination junction can offer many advantages: (1) the higher carrier density generally available in microcrystalline versus amorphous silicon more easily supports the high electric fields required while using very thin layers; (2) more efficient recombination occurs due to the smaller mobility gap and the increased doping density, as well as to increased tunneling in the very thin layers; and (3) the optical absorption loss due to the tunnel junction layers can be reduced because of the lower absorption coefficient of microcrystalline silicon (μcSi) in the visible wavelengths as well as because of the use of thinner layers.

At open circuit conditions, the voltage of the multi-junction solar cell should ideally be the sum of the voltage developed across each p-i-n junction if there is no voltage dropped across the tunnel junctions. However, for non-ideal tunnel junctions a significant voltage of opposite polarity with that generated by the p-i-n junctions in the device can occur due to accumulation of photocarriers near the tunnel junction, and thus reduce the open circuit voltage.

However, the high doping density and high electric field associated with the use of microcrystalline silicon (μc-Si) can improve open circuit voltage ($V_{oc}$). More efficient recombination in the tunnel junction will minimize charge accumulation near that junction. Furthermore, the short circuit current of the tandem device may be increased by use of microcrystalline tunnel junction layers.

Another important quality for the doped layers used in solar cells, besides good electrical properties, is low optical absorption. In contrast to single crystalline devices where p-n junctions can be used, photons absorbed in amorphous doped layers are lost because the diffusion length of photocarriers is extremely short in those layers. This requirement is especially important for the p-layer through which light enters into the device. It is partly for this reason that amorphous silicon carbon (a-SiC:H) p-layers with an optical bandgap ~2.0 eV have often been used instead of amorphous silicon (a-Si:H) p-layers. Converting amorphous a-Si:H to μc-Si also lowers the optical absorption in the short wavelength region due to the selection rule for optical transitions in crystalline grains. The absorption coefficient of a μc-Si p-layer is higher than that of the amorphous silicon carbon (a-SiC:H) p-layer typically used in the solar cells.

However, except for very few reported successes, microcrystalline silicon so far has not been widely used in amorphous silicon (a-Si:H) solar cells, at least for commercial applications. The main difficulties are perhaps in making extremely thin layers of μc-Si($\leq 100$ Å), which is necessary in order to reduce the optical loss, and in alloying with carbon for raising the optical bandgap. Prior art attempts have resulted in unacceptable long induction times and damaged solar cells with rough non-uniform surfaces.

The bulk properties of microcrystalline silicon (μc-Si) are very different from those of extremely thin layers made under the same microcrystalline condition. Therefore, the bulk properties of microcrystalline silicon have little relevance to the application of μc-Si in solar cells where only ultra-thin layers are used. When examining the thickness dependencies of conductivity and activation energy for films made under conventional microcrystalline p-layer conditions, it can be observed that the film properties change dramatically when the microcrystalline thickness is below ~1000 Å. This is not surprising because it is well known that nucleation is critical in forming crystalline grains on a heterogeneous substrate. Also, the properties of those films made under "microcrystalline" conditions may be strongly substrate dependent, especially for ultra-thin layers. Furthermore, whether the substrate is conducting or insulating apparently also influences the initial nucleation of μc-Si, at least in D.C. plasma. This makes it very difficult to characterize the exact material to be incorporated in the device because conventional material characterizations such as the conductivity measurement and Raman spectroscopy are usually made on samples deposited on different substrates. Therefore, it is important to find means to characterize the ultra-thin layers exactly as or similar to those incorporated in the devices, and to develop proper methods to promote fast nucleation of μc-Si on desired substrates.

Raman spectroscopy is a very sensitive tool to distinguish microcrystalline materials from amorphous. However, for ultra-thin films on the order of 100 Å it is essential that the samples are deposited on metal or other substrates which generate very low scattering signals in the spectral range of interest. Quartz substrates usually have an excessive photoluminescence background that washes out the Raman signal from the subject film. Also, when the ultra-thin layer is deposited on a relatively thick a-Si:H layer the Raman signal of the top layer can be dominated by that due to amorphous silicon (a-Si:H) underneath. Therefore, to study the properties of a microcrystalline ultra-thin layer on amorphous silicon (a-Si:H) using Raman spectroscopy, it is best to first deposit an ultra-thin a-Si:H layer of ~50 Å on a metal substrate and then deposit the microcrystalline overlayer. In the past, it has been found that microcrystalline silicon (μc-Si) forms much more readily on stainless steel substrates than on an amorphous silicon (a-Si:H) layer.

It is, therefore, desirable to provide better processes for producing improved microcrystalline silicon solar cells.

SUMMARY OF THE INVENTION

Special processes are applied to produce improved microcrystalline multi-junction solar cells and single junction solar cells for use in solar modules. Advantageously, the improved process and novel solar cells achieve unexpected and surprisingly good results. The inventive process and solar cells provide better conversion efficiency, fill factor (FF) and open circuit voltage ($V_{oc}$). Desirably, the novel process and solar cells are economical, attractive, and effective.

The special processes include: forming solar cells by plasma enhanced chemical vapor deposition with a feedstock diluted by a diluent. The solar cells can comprise a doped layer having one polarity, an active intrinsic layer, and a doped layer having an opposite polarity. In order to produce superior solar cells, the special processes of the invention provide for treating the surface of one of the layers with the diluent alone, in the absence of the feedstock and, thereafter, growing microcrystalline material on the treated surface. For best results, the treatment material does not include the deposition feedstock, either alone or in combination with the diluent.

The treated layer can comprise an amorphous material such as amorphous silicon, amorphous silicon carbon, or amorphous silicon germanium. The microcrystalline material can be microcrystalline silicon, microcrystalline silicon carbon, or microcrystalline material silicon germanium. In one embodiment, the doped layers comprise microcrystalline material. In another embodiment, a runnel junction layer is grown on one of the doped layers and the runnel junction layer comprises at least one microcrystalline layer.

One preferred process comprises fabricating multi-junction solar cells by plasma enhanced chemical vapor deposition by forming a microcrystalline sandwich with a microcrystalline runnel junction layer between a first (front) solar cell and a second (back) solar cell. The first solar cell has a positively doped $p_1$ layer, an active instrinic $i_1$ layer, and a negatively doped $n_1$ layer. The second solar cell has a positively doped $p_2$ layer, an active instrinic $i_2$ layer, and a negatively doped $n_2$ layer. A tunnel junction or recombination junction connects the first solar cell to the second solar cell. The tunnel junction comprises a negatively doped layer from one of said solar cells, a positively doped layer from the other solar cell, and at least one intermediate tunnel junction layer positioned between said first and second solar cells.

Desirably, the runnel junction layer is fabricated by etching treatment of one of the doped layers in the tunnel junction to form an etched surface thereon and, thereafter, nucleating from the etched surface to form and grow a microcrystalline tunnel junction layer. As used in this application, the term "nucleating" means the initial growth phase of microcrystalline layers. Etching can comprise plasma etching with an etchant (treatment material), such as hydrogen, deuterium, HD, helium, and argon. In the preferred process, etching comprises hydrogen etching alone by DO or RF plasma while preventing substantial optical and electrical damage to the doped layers. Furthermore, for best results, silane or other feedstock is prevented from being deposited with the etchant.

Nucleating from the etched surface is provided to accelerate microcrystalline growth. Microcrystalline nucleation can by accomplished by plasma enhanced chemical vapor deposition with a dopant and a feedstock diluted with a diluent. The dopant can be: an n-type dopant, such as phosphine ($PH_3$) or other phosphorous-containing compounds; or a p-type dopant, such as diborane ($B_2H_6$), $BF_3$, or other boron, containing compounds. The feedstock can be: silane ($SiH_4$), disilane ($Si_2H_6$), tetramethyl silane, $Si(CH_3)_4$, $SiF_4$, $SiHF_3$, $SiH_2Cl_4$, $CH_N(SiH_3)_{4-N}$ wherein N is an integer in the range of 0 to 3, a carbon based feedstock, or a germanium based feedstock. The feedstock can also have the general formula $Si_NH_{2N+2-M}Y_M$ wherein:

Si=silicon
H=hydrogen or deuterium
Y=a halogen [fluorine (F), chlorine (Cl), bromine (Br), Iodine (I), etc.]
N=positive integer$\geq 1$
M=positive integer; and
$2N+2-M\geq 0$.

The diluent can be hydrogen ($H_2$), deuterium ($D_2$), or HD. The dilution ratio of the diluent to the feedstock can range from about 50:1 to about 200:1.

Plasma enhanced chemical vapor deposition (PECVD) can be by: cathodic direct current (DC) glow discharge, anodic DC glow discharge, radio frequency (RF) glow discharge, very high frequency (VHF) glow discharge, alternating current (AC) glow discharge, or microwave glow discharge. Plasma enhanced chemical vapor deposition of microcrystalline layers can be accomplished at a temperature ranging from 80°–300° C., at a pressure ranging from 0.5–5 Torr, with a dilution ratio of diluent to the feedstock (deposition gas) ranging 50:1 to 200:1.

The process preferably includes depositing a conducting (conductive) oxide, such as tin oxide or zinc oxide on a glass substrate, a stainless steel substrate, or other substrate, and thereafter, placing one of the doped layers, e.g. the $p_1$ layer in a p-i-n solar cell or the $n_1$ layer in a n-i-p solar cell, on the conducting oxide substrate. The exterior surface of the other solar cell, e.g. the $n_2$ layer of a p-i-n solar cell or the $p_2$ layer of a n-i-p solar cell is covered by a contact plate, e.g., aluminum, silver, metal or other conductive material for a p-i-n solar cell or a conducting oxide layer for a n-i-p solar cell.

The tunnel junction of the inventive multi-junction solar cell has an etched surface and at least one microcrystalline tunnel junction layer sandwiched between a doped layer of one solar cell and an opposite doped layer of the other solar cell. In the preferred form, the etched surface is a hydrogen plasma etched surface, such as an n-doped amorphous silicon surface or a p-doped amorphous silicon surface. The microcrystalline tunnel junction layer can be a p-type microcrystalline layer and/or an n-type microcrystalline layer and the microcrystalline layer can be microcrystalline silicon carbon, microcrystalline silicon germanium, or microcrystalline silicon. Desirably, the microcrystalline layer can have a thickness of 50–120 Å, and preferably from 80–100 Å for best results. In one form, the tunnel junction comprises an n-type doped amorphous layer, an n-type microcrystalline tunnel junction layer, and a p-type doped amorphous layer. In another form, the tunnel junction comprises a p-type microcrystalline tunnel junction layer in lieu of or in addition to the n-type microcrystalline runnel junction layer.

At least one of the solar cells can be a p-i-n solar cell or an n-i-p solar cell. Furthermore, at least one of the layers, i.e. the n layer, i layer, and/or p layer, in one the solar cells can comprise hydrogenated amorphous silicon, hydrogenated amorphous silicon carbon, or hydrogenated amorphous silicon germanium.

The application of the microcrystalline doped layers in amorphous silicon (a-Si:H) based solar cells relies on the ability to promote nucleation of microcrystallinity on desired surfaces. With an appropriate surface preparation as described in the process of this invention, microcrystalline silicon (μc-Si) layers as thin as 80–100 Å can be formed successfully on amorphous silicon (a-Si:H). We have incorporated μc-Si layers in the tunnel junction of multi-junction devices and in single junction solar cells and have demonstrated significant improvement in all aspects of the photovoltaic devices as a result of the inventive processes. Advantageously, the novel process can produce multi-junction tandem solar cells and single junction solar cells with improved open circuit voltages ($V_{oc}$), fill factors (FF), and conversion efficiencies.

A more detailed explanation of the invention is provided in the following description and appended claims taken in conjunction with the accompanying drawings.

DETAILED DESCRIPTION OF THE PREFERRED EMBODIMENTS

Figure 1:
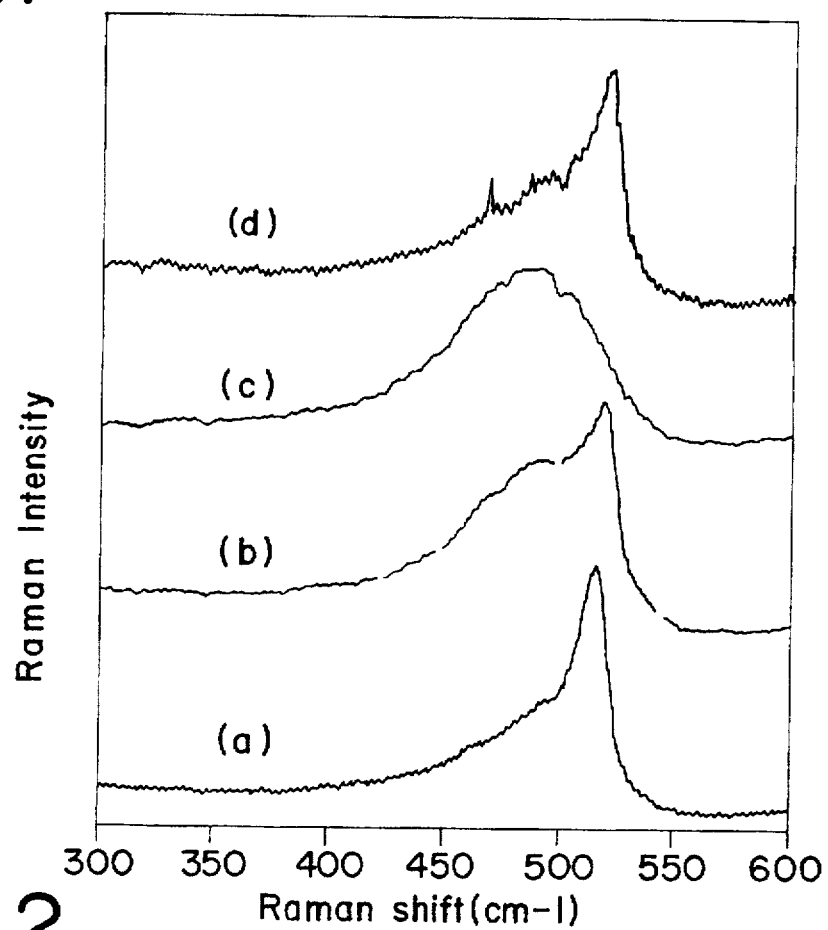
FIG. 1 is a graph of the Raman spectra of films made under n-type microcrystalline conditions.

Applicants' process for producing solar cells comprises fabricating multi-junction tandem solar cells by plasma enhanced chemical vapor deposition. In the process, a conductive oxide layer is deposited on the surface of a light-transmissive vitreous substrate, such as transparent glass or translucent glass. The conducting oxide can be tin oxide and zinc oxide. A first p-i-n solar cell is formed by depositing: a positively doped $p_1$ layer on the conducting oxide, an active instrinic $i_1$ layer on the $p_1$ layer, and a negatively doped $n_1$ layer on the $i_1$ layer.

Significantly, the $n_1$ layer is treated with a hydrogen plasma etch (without silane) for a period of about 150 to about 750 seconds without damaging the optical and electrical properties of said $n_1$ layer. Thereafter, the hydrogen treated $n_1$ layer is nucleated with a negatively doped hydrogen plasma and a silicon-containing feedstock to form a negatively doped microcrystalline tunnel junction or microcrystalline recombination junction (μn) layer having a thickness of about 50 Å to about 120 Å.

Next in the process, a second p-i-n solar cell is formed by depositing: a positively doped $P_2$ layer on the microcrystalline n-layer (μn layer), an active instrinic $i_2$ layer on the $p_2$ layer, and a negatively doped $n_2$ layer on the $i_2$ layer.

The first p-i-n solar cell is connected to the second p-i-n solar cell with the microcrystalline tunnel junction (recombination junction) comprising the $n_1$ layer, the μn layer, and the $p_2$ layer. An aluminum, silver, or other metal back plate can be placed on the $n_2$ layer. A portion of the back plate can be coated with a back plate-conducting oxide, such as tin oxide or zinc oxide.

Plasma enhanced chemical vapor deposition of the microcrystalline layers can be accomplished in many ways. Plasma enhanced chemical vapor deposition can be carried out with a feedstock diluted with a diluent. The dilution ratio of the diluent to said feedstock can range from about 50:1 to 200:1. The diluent can be hydrogen, deuterium, and/or HD. The feedstock can be: silane, disilane, tetramethyl silane, $SiF_4$, $SiHF_3$, $SiH_2Cl_4$, $CH_N(SiH_3)_{4-N}$ wherein N is an integer in the range of 0 to 3, a carbon based feedstock or, a germanium based feedstock. The feedstock can also have the general formula $Si_NH_{2N+2-M}Y_M$ wherein:

Si=silicon
H=hydrogen or deuterium
Y=a halogen
N=positive integer $\geq 1$
M=positive integer; and
2N+2–M$\geq$0.

The $n_1$ and $n_2$ layers are preferably formed by plasma enhanced chemical vapor deposition with an n-type dopant, such as phosphine ($PH_3$) or other phosphorous-containing compounds. The $p_1$ and $p_2$ layers are preferably formed by plasma enhanced chemical vapor deposition with a p-type dopant, such as diborane ($B_2H_6$), $BF_3$, or other boron-containing compounds.

Plasma enhanced chemical vapor deposition can comprise DC or RF glow discharge under the following conditions: a temperature of the substrate ranging from about 80° C. to about 300° C.; a pressure ranging from about 0.5 to about 5 Torr; and a power density ranging from about 50 to about 230 mW/cm$^2$.

In the multi-junction tandem solar cell, the $i_1$ and $i_2$ layers comprise an active hydrogenated compound, such as amorphous silicon, amorphous silicon carbon or amorphous silicon germanium. The active $p_1$ and $p_2$ layers comprise a p-doped hydrogenated compound, such as p-doped amorphous silicon, p-doped amorphous silicon carbon, or p-doped amorphous silicon germanium. The active $n_1$ and $n_2$ layers comprise an n-doped hydrogenated compound, such as n-doped amorphous silicon, n-doped amorphous silicon carbon, or n-doped amorphous silicon germanium. Preferably, the negatively doped, microcrystalline runnel junction μn layer has a thickness of about 80 Å to about 100 Å.

The microcrystalline tunnel junction layer can also comprise a composite microcrystalline tunnel junction or composite microcrystalline recombination junction layer. The composite microcrystalline tunnel junction layer comprises a negatively doped microcrystalline tunnel junction (μn-type) layer and a positively doped microcrystalline tunnel junction (μp-type) layer. The negatively doped microcrystalline tunnel junction μn layer is disposed between the $n_1$ layer and the positively doped microcrystalline runnel junction μp layer. The positively doped microcrystalline tunnel junction μp layer is disposed between the μn layer and the $p_2$ layer.

In the preferred process of producing multi-junction tandem solar cells, the surface of the amorphous silicon i-layer is etched for a period of about 300 to about 500 seconds with a hydrogen plasma etchant; and an n-type doped layer is nucleated to form an n-type microcrystalline silicon layer having a thickness of about 80 Å to about 100 Å. A microcrystalline tunnel junction μp layer can be formed by subjecting the microcrystalline tunnel junction μn layer to a positively doped hydrogen plasma and a silicon-containing feedstock to form the microcrystalline tunnel junction μp layer on the microcrystalline tunnel junction μn layer.

The photovoltaic device preferably comprises multi-junction tandem solar cells with a light-transmissive vitreous substrate of transparent glass or translucent glass. A conducting oxide, such as tin oxide or zinc oxide, can be deposited on a surface of the substrate. The multi-junction tandem solar cells include: a first p-i-n solar cell comprising a positively doped $p_1$ layer on the conducting oxide, an active instrinic $i_1$ layer on the $p_1$ layer, and a negatively doped amorphous $n_1$ layer on the $i_1$ layer. Significantly, the $n_1$ layer is treated to have a hydrogen plasma etched surface (in the absence of silane) or other feedstock to produce an $n_1$ layer with better solar cell-grade optical and electrical properties. A negatively doped, microcrystalline tunnel junction μn layer having a thickness of about 50 Å to 120 Å, preferably 80 Å to 100 Å, is deposited on the etched surface. The multi-junction tandem solar cells also have: a second p-i-n solar cell comprising: a positively doped $p_2$ layer on the microcrystalline tunnel junction μn layer, an active instrinic $i_2$ layer on the $p_2$ layer, and a negatively doped $n_2$ layer on the $i_2$ layer. Positioned on the exterior surface of the $n_2$ layer is a back plate made of aluminum, silver, or other conductive metal. A portion of the back plate can be coated with a back plate conducting oxide, such as tin oxide or zinc oxide. The first p-i-n solar cell is connected to the second p-i-n solar cell with a microcrystalline tunnel junction or micro crystalline recombinant junction comprising the $n_1$ layer, μn layer, and the $p_2$ layer.

At least one of the layers in one of the solar cells comprises hydrogenated amorphous silicon, hydrogenated amorphous silicon carbon, or hydrogenated amorphous silicon germanium. The microcrystalline tunnel junction layer can comprise a germanium, or microcrystalline silicon. Preferably, the $n_1$ layer comprises n-doped amorphous silicon; and the microcrystalline tunnel junction μn layer comprises n-doped microcrystalline silicon. The tunnel junction can be doped with phosphine, such as at the following ratio: 10,000 hydrogen: 100 silane: 2 phosphine. The microcrystalline tunnel junction layer can also include a microcrystalline tunnel junction μp layer comprising p-doped microcrystalline silicon. The $p_2$ layer can comprise p-doped amorphous silicon.

Figure 3:
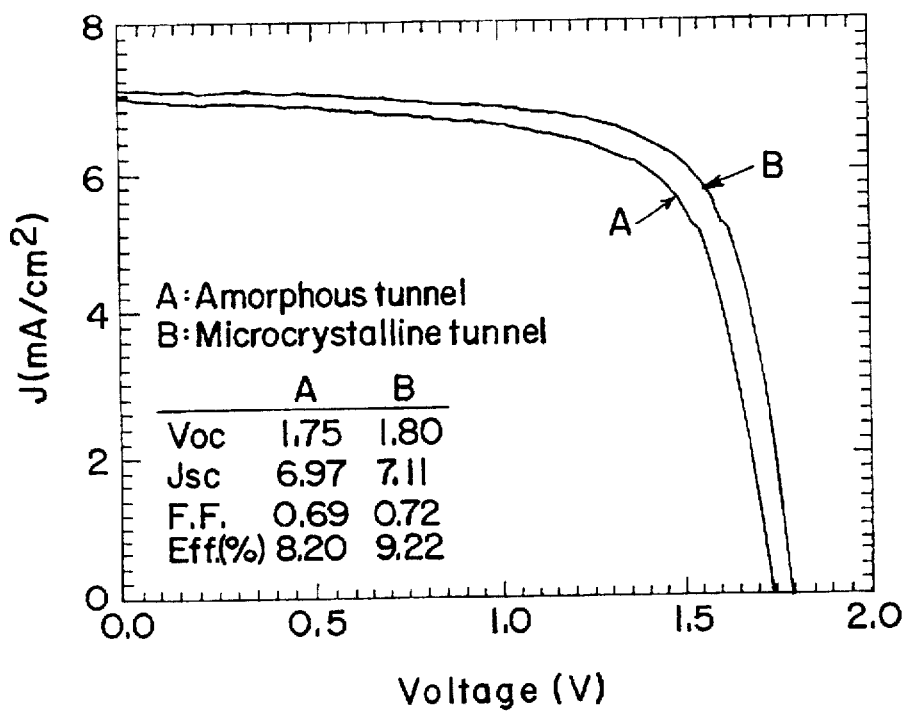
FIG. 3 is a graph of the J–V curves of multi-junction tandem solar cells where the open circuit voltages and closed circuit currents of the solar cells are also listed.
Figure 4:
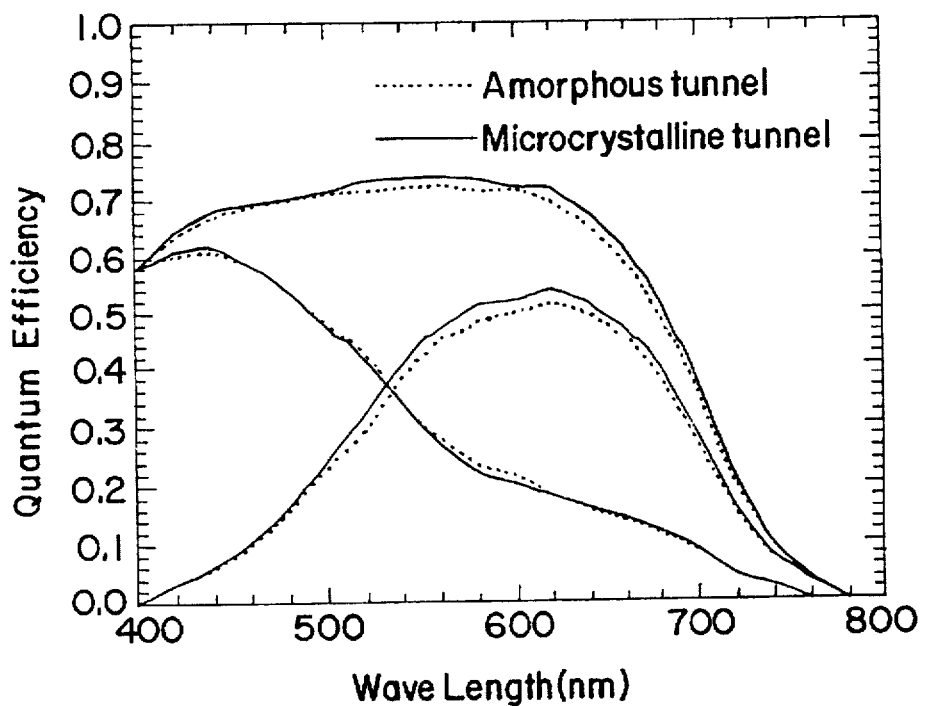
FIG. 4 is a graph of the quantum efficiencies of the multi-junction tandem solar cells of FIG. 3 as a function of wave length.

We have fabricated multi-junction devices using various combinations of microcrystalline silicon (μc-Si) in the recombination junction, including a-Si:H(n)/μc-Si(p), μc-Si (n)/a-Si(n)/a-SiC:H(p) and μc-Si(n)/μc-Si(p). Compared to a traditional tunnel junction using all amorphous materials, the junction using μc-Si n/a-SiC:H p yielded significant improvement in all aspects of device performance. FIG. 3 and 4 show the J-V characteristic and quantum efficiency of two a-Si:H/a-Si:H tandem cells which are identical except for the tunnel junction. The Mayer thicknesses for the two junctions are ~700 Å and ~3000 Å, respectively. The microcrystalline tunnel junction improved open circuit voltage ($V_{oc}$) by almost 50 mV and raised the fill factor (FF) from 60% to 72%. The short circuit current of the second junction, obtained by integrating the QE with an AM1.5 spectrum, is also increased by about 3%. This increase in short circuit current occurs at wavelengths expected to be influenced by tunnel junction absorption. Significantly, the incorporation of microcrystalline silicon (μc-Si) after etching in accordance with the process of this invention, improved the conversion efficiency of the tandem amorphous silicon (a-Si:H) solar cell by more than 10%.

Photovoltaic devices comprising single junction solar cells can also be produced by applicants' process. The single junction solar cells have: a p-type doped layer, an intrinsic amorphous i-layer, and an n-type doped layer with at least one of the layers (p, i or n) having an etched surface. In the single junction solar cells of this invention, at least one of the doped layers comprises a microcrystalline doped layer which is positioned adjacent to and abuts against the etched surface of the i-layer. Desirably the microcrystalline doped layer has a thickness of about 50 Å to about 120 Å. Preferably, the etched surface of the i-layer in the single junction solar cells comprises a hydrogen plasma etched surface without silane so as to promote nucleation of the subsequently deposited microcrystalline doped layer. Furthermore, the single junction solar cells can have one or more composite doped layers comprising amorphous silicon and microcrystalline silicon.

The single junction solar cell can comprise a p-i-n solar cell with an i-layer of amorphous silicon, amorphous silicon carbon, or amorphous silicon germanium. The microcrystalline doped layer in the p-i-n single junction solar cell can be microcrystalline silicon, microcrystalline silicon carbon, or microcrystalline silicon germanium. Preferably, the i-layer comprises amorphous silicon, and the n-type doped layer comprises an n-type microcrystalline silicon layer having a thickness of about 80 Å to about 120 Å.

We have made single junction amorphous silicon (a-Si:H) solar cells using microcrystalline silicon μc-Si p-layers. Good open circuit voltages (~0.88V) and fill factors (70%) were obtained. Short circuit currents of these devices were relatively low, which can be attributed to the high absorption coefficient of the μc-Si p-layer as compared to the standard amorphous silicon carbon (a-SiC:H) p-layers.

The single junction solar cell can be mounted on a glass substrate, a stainless steel substrate, or a metal substrate. Desirably, the substrate comprises a light transmissive vitreous transparent glass substrate or translucent glass. The substrate can be coated with tin oxide or zinc oxide.

For single and multi-junction solar cells, the microcrystalline doped layer, microcrystalline tunnel junction layer or microcrystalline recombination junction layer should be thin, preferably 50–120 Å, and most preferably 80–100 Å to: (1) establish an electrical field inside the intrinsic i-layer, (2) increase reflection of light to the i-layer, and (3) minimize absorption.

As discussed above, etching preferably comprises hydrogen ($H_2$) plasma treatment: Table 1 below summarizes the typical condition and duration for the $H_2$ plasma treatment to promote fast nucleation of the μc-Si layer. It should be noted that a minimum duration of $H_2$ plasma treatment (hydrogen etching) is recommended in order to allow immediate nucleation of the subsequently deposited μc-Si layer. The minimum duration of hydrogen etching ($H_2$ plasma) we found in our study is about 150 seconds, depending on the plasma condition. FIG. 1 shows a series of Raman spectra where a clear transition from amorphous to microcrystalline phase as seen for ~100 Å layers made under the bulk μc-Si condition on a-Si:H treated by $H_2$ plasma for 450 seconds and 600 seconds, respectively.

TABLE 1

| Typical Condition For $H_2$ Plasma Treatment | | | | |
|---|---|---|---|---|
| Temperature (°C.) | Pressure (Torr) | $H_2$ Flow Rate (sccm) | Power Density (mW/cm²) | Duration (sec) |
| 80–300 | 0.5–5 | 100–2000 | 50–230 | 150–750 |

Conditions for μc-Si deposition: it has been reported extensively that bulk μc-Si films can be deposited using flow discharge of silane in a large amount of $H_2$ dilution. Unexpectedly and surprisingly, our study shows that with our etched surface preparation by plasma etching, the same deposition condition can result in μc-Si layers as thin as 50 Å. Table 2 below lists the typical deposition parameters for the μc-Si layer.

TABLE 2

Typical Condition For μc-Si Layer Deposition

| Temperature (°C.) | Pressure (Torr) | Power Density (mW/cm²) | $H_2/SiH_4$ ratio |
|---|---|---|---|
| 80–300 | 0.5–5 | 50–230 | 50–200:1 |

We have incorporated μc-Si n and p layers of ~80 Å thickness into multi-junction solar cells. Large improvements in the open circuit voltage ($V_{oc}$), fill factor (FF), and short circuit current ($I_{sc}$) have been observed. FIGS. 3 and 4 show the I-V curves and quantum efficiencies of Si/Si double junction solar cells with amorphous or microcrystalline runnel junctions. The key device parameters are also listed in FIG. 3.

Tandem solar cells are intrinsically more stable than single-junction photovoltaic devices with the same light absorbing capabilities. Tandem solar cells can have layers of hydrogenated amorphous silicon separated by a tunnel junction and arranged in a stacked configuration. The thickness of the layers can be adjusted to maximize efficiency and equalize the current generated in each layer. The tandem solar cells can have the bandgap of the amorphous silicon layers varied by adjusting the hydrogen concentration in the amorphous silicon layers.

Some typical multi-junction solar cells are shown in Tables 3–5.

TABLE 3

Three Junction (Si/Si/SiGe) Solar Cell

| | | Thicknesses | |
|---|---|---|---|
| Component | Material | Broadest | Preferred |
| Substrate | Glass | | |
| transparent oxide | ZnO or $SnO_2$ | | |
| $p_1$ - layer | p-doped SiC | | |
| $i_1$ - first intrinsic layer | i-Si | 100–2000Å | 400–1000Å |
| first recombination junction | Comprises the n-layer from the first junction and the p-layer from the second. However n- and/or p-layers may be microcrystalline. There may be additional layers introduced as well. | <500Å | <300Å |
| $i_2$ - second intrinsic layer | i-Si | 900–10000Å | 2000–5000Å |
| second recombination junction | See Above | | |
| $i_3$ - third intrinsic layer | i-SiGe | 500–5000Å | 1200–4500Å |
| $n_3$ - layer | n-Si | | |
| rear contact | Al or Ag | | |

TABLE 4

Si/Si Tandem Solar Cells

| | | Thicknesses | |
|---|---|---|---|
| Component | Material | Broadest | Preferred |
| Substrate | Glass | | |
| Transparent Oxide | Same as Table 3 | | |
| $p_1$ - layer | Same as Table 3 | | |
| $i_1$ - layer | i-Si | 100–2000Å | 600–1000Å |
| Recombination junction | Same as Table 3 | | |
| $i_2$ - layer | i-Si | 1500–10000Å | 2500–4000Å |
| $n_2$ - layer | n-Si | | |

TABLE 5

Si/SiGe Tandem Solar Cells

| | | Thicknesses | |
|---|---|---|---|
| Component | Material | Broadest | Preferred |
| Substrate | Glass | | |
| transparent oxide | Same as Table 3 | | |
| $p_1$ - layer | Same as Table 3 | | |
| $i_1$ - layer | i-Si | 300–4000Å | 600–1750Å |
| recombination junction | Same as Table 3 | | |
| $i_2$ - layer | i-SiGe | 750–5000Å | 1200–3000Å |
| $n_2$ - layer | n-Si | | |

Cell Testing and Characteristics

In order to promote the formation of microcrystalline on an a-Si:H surface where μc-Si doped layers are to be deposited in device applications, we have developed an effective surface preparation method (etching) (described above) which allows immediate formation of μc-Si within the first 100 Å on a-Si:H. Curve (d) in FIG. 1 shows us the Raman Spectrum of a 100 Å μc-Si n-layer deposited on a 100 Å on a-Si:H layer after the appropriate surface treatment ($H_2$ etching). A large volume fraction of microcrystalline material was formed in the ultra-thin layer which would have otherwise been amorphous without the surface treatment as shown by Curve (c) in FIG. 1.

FIG. 1 illustrates the Raman sectra of films on various substrates: (a) a thick film on fused silica; (b) an ultra thin layer (~100 Å) on stainless steel; (c) the same ultra thin layer made on a thin amorphous silicon (a-Si:H) layer; and (d) the same ultra thin layer on surface treated (hydrogen etched) amorphous silicon (a-Si:H) layer.

Figure 2:
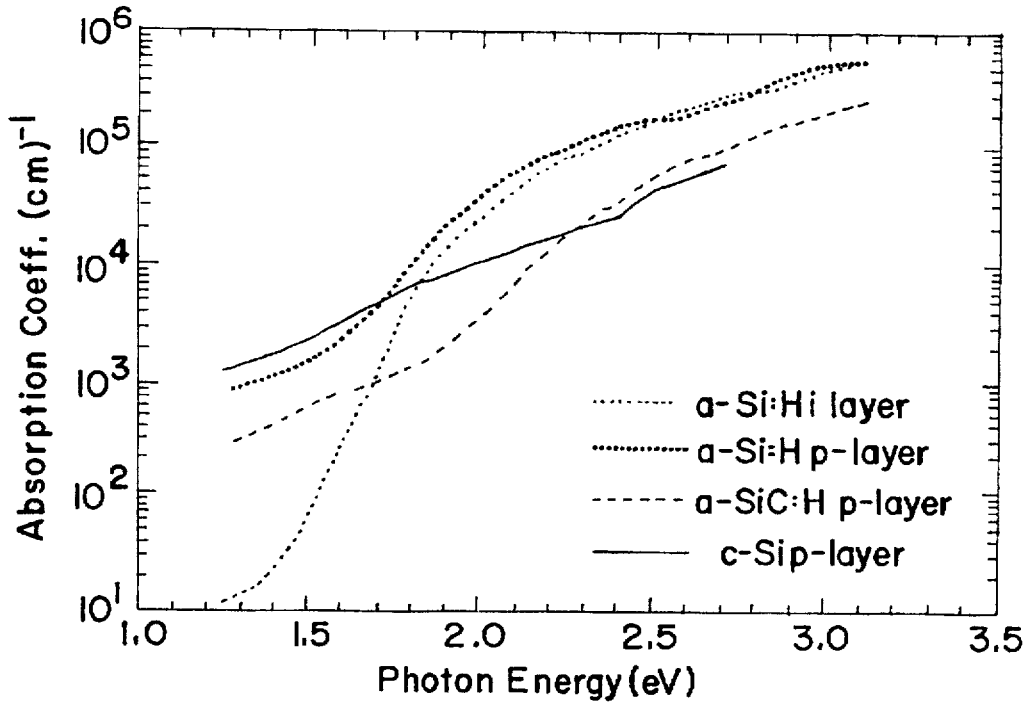
FIG. 2 is a graph of the optical absorption coefficient as a function of photon energy for various layers.

FIG. 2 is a graph of the optical absorption coefficient as a function of photon energy for an amorphous silicon (a-Si:H) i-layer, an amorphous silicon (a-Si:H) p-layer, and amorphous silicon carbon (a-SiC:H) p-layer, and a microcrystalline (μc-Si) p-layer.

There are standard tests of initial performance. In the first initial performance test light-V measurement, the cell is placed under a light source providing simulated sunlight and its electrical performance is determined. A commercial or modified commercial simulator can be used. The second initial performance test is called the quantum efficiency measurement and provides information on the ability of the cell to use light of different wavelengths. The properties of amorphous silicon, and hence a-Si based solar cells, degrade with exposure to light. Sodium vapor lamps provide a bright steady light source. Although the spectrum of these lamps is different from the solar spectrum, we have found that as long as the light intensity is the same, the spectral distribution does not matter very much and can be accounted for. Cells are placed on the lamp, which is calibrated the same way as the simulator, and the electrical performance is monitored as a function of time.

The most significant measure of a solar cell is its conversion efficiency. The conversion efficiency is the percentage of the energy of the light impinging on the cell converted to electrical energy which can be used by an external load, e.g. a light bulb.

The energy in sunlight (striking a flat surface at solar noon) is about 100 mW/cm². For convenience, solar simulators are calibrated so that the energy that they radiate is as close as possible to 100 mW/cm². Therefore, the procedure is to measure how much energy is being produced by the cell when illuminated.

The output of a solar cell can be determined by: $V_{oc}$=open circuit voltage, $P_{max}$=maximum solar cell power and $J_{sc}$= short circuit current. The cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\begin{aligned}\text{Efficiency (\%)} &= (P_{max}/P_{incident}) \times 100 \\ &= (P_{max}/100) \times 100 \\ &= P_{max} \\ \text{Efficiency} &= P_{max} = V_{max} \times J_{max} \\ &= V_{oc} \times J_{sc} \times FF\end{aligned}$$

$V_{oc}$=Open circuit voltage, i.e. the voltage developed by cell when no current is dram (cell is open circuited). If you measure the voltage across the terminals of your car battery with a voltmeter, you will be measuring the open circuit voltage (a little over 12V).

$J_{sc}$=Short circuit current, i.e. the current passed by cell if it is short circuited. If you drop a wrench across the terminals of your car battery, you will be passing the short circuit current (hundreds of amps) through the wrench. Short circuit currents on solar cells are much smaller and not nearly as dangerous.

FF=ratio of $P_{max}$ to $V_{oc} \times J_{sc}$

Efficiency is really given by: Efficiency=$(P_{max}/P_{incident}) \times$ 100. However, in practice $P_{incident}$ (power of light incident on cell) is set to 100 so that efficiency=$P_{max}$. Fill factor (FF) is a number used to express efficiency in terms of open circuit voltage ($V_{oc}$) and short circuit current ($J_{sc}$).

Alternative Feedstocks

While silane and hydrogen are the preferred feedstocks for best results, there are many alternative feedstocks for undoped plasma-enhanced chemical vapor deposition (CVD) a-Si:H and a-SiC:H alloys. The diluent hydrogen ($H_2$) can be replaced by deuterium (D), with the diluent gas being HD or $D_2$. The alternative feedstocks for saline ($SiH_4$), in addition to $SiH_4$ or instead of $SiH_4$, can be expressed by the following general formula: $Si_NH_{2N+2-M}Y_M$, where Si is silicon, H is hydrogen or deuterium, Y is a halogen, e.g. fluorine (F), chlorine (Cl), etc., N and M are positive integers under the constraint that $N \geq 1$ and $2N+2M \geq 0$. Examples of the above formula include silane ($SiH_4$), N=1, M=0, disilane ($Si_2H_6$), N=2, M=0, $SiF_4$ (N=1, M=4, Y=fluorine), $SiHF_3$ (N=1, M=3, Y=fluorine), $Si_2H_4Cl$ (N=2, M=4, Y=chlorine), tetramethyl silane, etc. When the alternative Si feedstocks are used, the optimal or preferred deposition conditions may have to be adjusted.

For hydrogenated amorphous silicon carbon (a-SiC:H) deposition, the alternative carbon feedstocks are numerous. In general, most typical hydrocarbons or hydrogen-halogen-carbon compounds can be used, e.g. $CH_4$, $C_2H_2$, $C_2H_4$, $C_2H_6$, $CF_4$, $C_3H_8$, $CDCl_3$. Other carbon feedstocks can be used which contain built-in carbon-silicon bonds, which can be expressed by the formula: $CH_N(SiH_3)_{4-N}$, wherein N is an integer in the range of 0 to 4, e.g. $CH_3SiH_3$ (methylsilane or silymethane), $CH(SiH_3)_3$ (trisilymethane). The H in the second compound ($SiH_3$), in the above formula can be replaced by a halogen, e.g. $CH(SiF_3)_3$. When an alternative carbon feedstock is used in addition to or in place of methane ($CH_4$), the deposition parameters such as $H_2$-dilution ratio and power density can be adjusted accordingly. In the process, deposition conditions of high pressure, low temperature and high diluent concentrations are used to attain stable solar cells with high open circuit voltages ($V_{oc}$) and high fill factors (FF).

Desirably, the absence of significant amounts of carbon radicals in amorphous silicon carbon can enhance microcrystalline silicon formation as can very high $H_2$-dilution. The deposition process may be applied to deposition of a-Si:H or other materials using the plasma enhanced CVD. This process covers the direct and remote plasma-CVD deposition of any material under conditions similar to those described above. Deposition parameters such as power density or electrical bias may be varied, if desired. The process is particularly useful to produce microcrystalline, a-S:H and a-SiC:H films, cells and solar modules. Excellent transport properties are obtained with the inventive process.

Increased hydrogen dilution can improve a-SiC:H widegap material. The process also provides better surface coverage by the hydrogen during growth, so as to attain higher surface mobility of growth precursors and a better chance of hydrogen compensation of defects. The process may also provide: better micro-structure, more uniform growth and less ion bombardment or the growth surface.

The inventive processes provide a relatively fast nucleation period and a speedy induction time for microcrystalline growth. Surface treatment by plasma etching, such as hydrogen plasma deposition, in accordance with the inventive processes, provides uniformly etched and smooth surfaces without damaging the optical and electrical properties or detracting from the appearance of the photovoltaic device. It is believed that plasma etching does not crystallize the surface, but serves as a catalyst and promoter to enhance microcrystalline nucleation and growth.

There are many advantages of using photovoltaic devices with microcrystalline tunnel junction layers, microcrystalline recombination junctions, or microcrystalline doped layers produced in accordance with the process of the present invention over amorphous silicon tunnel junctions and amorphous silicon doped layers:

1. Superior electrical capabilities.
2. Enhanced ohmic contact and hole properties.
3. Better conductivity.
4. Lower activation energy.
5. Closer to valence energy bands.
6. More efficient to establish electrical fields.
7. Higher mobility of electrons.
8. Optically more transparent.
9. Greater light transmission.
10. Improved conversion efficiency.
11. Excellent open circuit voltage, fill factor, and short circuit current.

Although embodiments of this invention have been shown and described, it is to be understood that various modifications and substitutions, as well as a rearrangement of parts, components, and process steps can be made by those skilled in the art without departing from the novel spirit and scope of this invention.

What is claimed is:

1. A process for fabricating a multi-junction solar cell by plasma enhanced chemical vapor deposition, comprising the steps of:

forming a first solar cell with a p-type doped layer $p_1$, an active instrinic layer $i_1$, and an n-type doped layer $n_1$;

forming a second solar cells with a p-type doped layer $p_2$, an active instrinic layer $i_2$, and an n-type doped layer $n_2$; and forming a tunnel junction connecting the first solar cell to the second solar cell, said tunnel junction comprising the n-type doped layer from one of said solar cells, the p-type doped layer from the other solar cell, and at least one intermediate tunnel junction layer positioned between said first and second solar cells;

wherein said intermediate tunnel junction layer is fabricated by first plasma etching a surface of one of said doped layers in said tunnel junction in the absence of a feedstock, and, thereafter, nucleating and growing from said etched layer to form a microcrystalline tunnel junction layer, said nucleating and growing comprising plasma enhanced chemical vapor deposition with a dopant and a feedstock diluted with a diluent, and said nucleating and growing commencing only after said plasma etching of said surface of said one of said doped layers.

2. A process in accordance with claim 1, wherein said plasma etching comprises plasma etching with an etchant selected from the group consisting of hydrogen, deuterium, HD, helium, and argon.

3. A process in accordance with claim 1, wherein said plasma etching comprises hydrogen plasma etching in the absence of silane.

4. A process in accordance with claim 1, including:

preventing damage to said doped layers during said plasma etching.

5. A process in accordance with claim 1:

wherein said dopant is selected from the group consisting of an n-type dopant and a p-type dopant, said n-type dopant being selected from the group consisting of phosphine ($PH_3$) and other phosphorous-containing compounds, said p-type dopant being selected from the group consisting of diborane ($B_2H_6$), $BF_3$, and other boron-containing compounds;

said feedstock being selected from the group consisting of silane, disilane, tetramethyl silane, $SiF_4$, $SiHF_3$, $SiH_2Cl_6$, $CH_N(SiH_3)_{4-N}$ wherein N is an integer in the range of 0 to 3, a carbon based feedstock, a germanium based feedstock, and compounds having the general formula $Si_NH_{2N+2-M}Y_M$ wherein:

Si=silicon
H=hydrogen or deuterium
Y=a halogen
N=positive integer $\geq 1$
M=positive integer; and
$2N+2-M \geq 0$ said diluent being selected from the group consisting of hydrogen, deuterium, and combinations thereof; and the dilution ratio of said diluent to said feedstock ranges from about 50:1 to about 200:1.

6. A process in accordance with claim 1, wherein said microcrystalline tunnel junction layer is selected from the group consisting of a p-type microcrystalline layer and an n-type microcrystalline layer.

7. A process in accordance with claim 1, wherein said tunnel junction comprises an n-type doped layer, an n-type microcrystalline tunnel junction layer, a p-type microcrystalline tunnel junction layer, and a p-type doped layer.

8. A process in accordance with claim 1, wherein said solar cells are selected from the group consisting of p-i-n solar cells and n-i-p solar cells.

9. A process in accordance with claim 1, wherein:

at least one of the layers in one of said solar cells comprises a hydrogenated amorphous silicon selected from the group consisting of amorphous hydrogenated silicon carbon, amorphous hydrogenated silicon germanium, and amorphous hydrogenated silicon; and said microcrystalline layer is selected from the group consisting of microcrystalline silicon carbon, microcrystalline silicon germanium, and microcrystalline silicon.

10. A process in accordance with claim 1, wherein said plasma enhanced chemical vapor deposition is selected from the group consisting of: cathodic DC glow discharge, anodic DC glow discharge, RF glow discharge, VHF glow discharge, AC glow discharge, and microwave glow discharge.

11. A process in accordance with claim 1, including:

depositing a conducting oxide on a substrate, said conducting oxide being selected from the group consisting of tin oxide and zinc oxide, and said substrate being selected from the group consisting of a glass substrate, a stainless steel substrate, and a metal substrate;

forming one of said doped layers of said first solar cell on said conducting oxide; and placing a surface of an electrically conductive plate on one of said doped layers of said second solar cell, said plate being fabricated of at least one material selected from the group consisting of aluminum, silver, metal, and other conductors.

12. A process for fabricating multi-junction tandem solar cells by plasma enhanced chemical vapor deposition, comprising the steps of:

depositing a conducting oxide on a surface of a light-transmissive vitreous substrate selected from the group consisting of transparent glass and translucent glass, said conducting oxide being selected from the group consisting of tin oxide and zinc oxide;

forming a first p-i-n solar cell by depositing a p-type doped layer $p_1$ on said conducting oxide, depositing an active instrinic layer $i_1$ on said layer $p_1$, and depositing an n-type doped layer $n_1$ on said layer $i_1$;

treating said layer $n_1$ with a hydrogen plasma etch in the absence of silane for a period of about 150 to about 750 seconds, said treating including etching said layer $n_1$ without damaging the optical and electrical properties of said layer $n_1$;

forming a microcrystalline tunnel junction layer by nucleating said hydrogen treated layer $n_1$ with an n-type doped plasma of hydrogen and a silicon-containing feedstock to form an n-type microcrystalline tunnel junction layer μn having a thickness of about 50 Å to about 120 Å, said nucleating occurring only after said hydrogen plasma etch of said layer $n_1$;

forming a second p-i-n solar cell by depositing a p-type doped layer $p_2$ on said microcrystalline tunnel junction layer comprising said layer μn, depositing an active instrinic layer $i_2$ on said layer $p_2$, and depositing an n-type doped layer $n_2$ on said layer $i_2$;

placing a back plate on said layer $n_2$, said back plate being fabricated of at least one material selected from the group consisting of aluminum, silver, metal, and other conductors; and said first p-i-n solar cell being connected to said second p-i-n solar cell with a microcrystalline tunnel junction comprising said layer $n_1$, said layer μn, and said layer $p_2$.

13. A process in accordance with claim 12, wherein:

said microcrystalline tunnel junction layer comprises a composite microcrystalline tunnel junction layer, said composite microcrystalline tunnel junction layer comprising said microcrystalline tunnel junction layer μn and a microcrystalline tunnel junction layer μp, said microcrystalline tunnel junction layer μn being disposed between said layer $n_1$ and said microcrystalline tunnel junction layer μp; and said microcrystalline tunnel junction layer μp being disposed between said layer μn and said layer $p_2$; and said microcrystalline tunnel junction layer μp being formed by subjecting said microcrystalline tunnel junction layer μn to a p-type doped plasma of hydrogen and a silicon-containing feedstock to form said microcrystalline tunnel junction layer μp on said microcrystalline tunnel junction layer μn.

14. A process in accordance with claim 12, including coating a portion of said back plate with a conducting oxide selected from the group consisting of tin-oxide and zinc oxide.

15. A process in accordance with claim 12, wherein:

plasma enhanced chemical vapor deposition of said microcrystalline tunnel junction layer comprises supplying a feedstock diluted with a diluent at a dilution ratio of said diluent to said feedstock in the range from about 50:1 to about 200:1, said diluent being selected from the group consisting of hydrogen, deuterium, and combinations thereof;

said feedstock being selected from the group consisting of silane, disilane, tetramethyl silane, $SiF_4$, $SiHF_2$, $SiH_2Cl_4$, $CH_N(SiH_3)_{4-N}$ wherein N is an integer in the range of 0 to 3, a carbon based feedstock, a germanium based feedstock, and compounds having the general formula $Si_NH_{2N+2-M}Y_M$ wherein:

Si=silicon
H=hydrogen or deuterium
Y=a halogen
N=positive integer≧1
M=positive integer; and
2N+2−M≧0 said layers $n_1$ and $n_2$ being formed by plasma enhanced chemical vapor deposition with an n-type dopant selected from the group consisting of phosphine ($PH_4$) and other phosphorous-containing compounds; and said layers $p_1$ and $p_2$ being formed by plasma enhanced chemical vapor deposition with a p-type dopant selected from the group consisting of diborane ($B_2H_6$), $BF_3$, and other boron-containing compounds.

16. A process in accordance with claim 12, wherein plasma enhanced chemical vapor deposition of said microcrystalline tunnel junction layer comprises direct current or radio frequency glow discharge under the following conditions:

the temperature of said substrate ranging from about 80° C. to about 300° C.;

the pressure ranging from about 0.5 to about 5 Torr; and the power density ranging from about 50 to about 230 mW/cm².

17. A process in accordance with claim 12, wherein:

said layers $i_1$ and $i_2$ comprise an active hydrogenated compound selected from the group consisting of amorphous hydrogenated silicon, amorphous hydrogenated silicon carbon, and amorphous hydrogenated silicon germanium;

said active layers $p_1$ and $p_2$ comprise a p-doped hydrogenated compound selected from the group consisting of amorphous hydrogenated silicon, amorphous hydrogenated silicon carbon, and amorphous hydrogenated silicon germanium; and said active layers $n_1$ and $n_2$ comprise an n-doped hydrogenated compound selected from the group consisting of amorphous hydrogenated silicon, amorphous hydrogenated silicon carbon, and amorphous hydrogenated silicon germanium.

18. A process in accordance with claim 12, wherein:

said treating of said layer $n_1$ with a hydrogen plasma etch is provided for a period of about 300 to about 500 seconds;

said n-type doped, microcrystalline tunnel junction layer μn has a thickness of about 80 Å to about 100 Å;

said feedstock comprises silane; and said layers $i_1$ and $i_2$ comprise amorphous hydrogenated silicon.

19. A multi-junction photovoltaic solar cell device, comprising:

a first solar cell with a p-type doped layer $p_1$, an active instrinic layer $i_1$, and an n-type doped layer $n_1$;

a second solar cell with a p-type doped layer $p_2$, an active instrinic layer $i_2$, and an n-type doped layer $n_2$;

a tunnel junction providing a recombination junction connecting the first solar cell to the second solar cell, said tunnel junction comprising an n-type doped layer from one of said solar cells, a p-type doped layer from the other solar cell, and at least one intermediate microcrystalline tunnel junction layer positioned between said first and second solar cell cells, and one of said doped layers in said tunnel junction having a plasma etched surface positioned adjacent said intermediate microcrystalline tunnel junction layer.

20. A photovoltaic device in accordance with claim 19, wherein said plasma etched surface comprises a surface etched in a hydrogen plasma in the absence of silane.

21. A photovoltaic device in accordance with claim 19, wherein said at least one microcrystalline tunnel junction layer is selected from the group consisting of a p-type microcrystalline layer and an n-type microcrystalline layer.

22. A photovoltaic device in accordance with claim 19, wherein said tunnel junction comprises an n-type doped layer, an n-type microcrystalline tunnel junction layer, a p-type microcrystalline tunnel junction layer, and a p-type doped layer.

23. A photovoltaic device in accordance with claim 19, wherein at least one of said solar cells is selected from the group consisting of a p-i-n solar cell and an n-i-p solar cell.

24. A photovoltaic device in accordance with claim 19, wherein:

at least one of the layers in one of said solar cells comprises hydrogenated amorphous silicon selected from the group consisting of amorphous hydrogenated silicon carbon, amorphous hydrogenated silicon germanium, and amorphous hydrogenated silicon; and said microcrystalline tunnel junction layer comprises a microcrystalline silicon- containing layer selected from the group consisting of microcrystalline silicon carbon, microcrystalline silicon germanium, and microcrystalline silicon.

25. A photovoltaic device in accordance with claim 19, comprising:
- a substrate selected from the group consisting of a glass substrate, a stainless steel substrate, and a metal substrate; and
- a conductive oxide on said substrate, said conducting oxide selected from the group consisting of tin oxide and zinc oxide.

26. A multi-junction tandem solar cell photovoltaic device, comprising:
- a light-transmissive vitreous substrate selected from the group consisting of transparent glass and translucent glass, said substrate having a surface portion;
- a conducting oxide on said surface portion, said conducting oxide selected from the group consisting of tin oxide and zinc oxide;
- a first p-i-n solar cell comprising a p-type doped layer $p_1$ on said conducting oxide, an active instrinic layer $i_1$ on said layer $p_1$, and an n-type doped amorphous layer $n_1$ on said layer $i_1$;
- said layer $n_1$ having a surface etched in a hydrogen plasma in the absence of silane; said etched surface having solar cell-grade optical and electrical properties;
- a microcrystalline tunnel junction layer comprising an n-type doped, microcrystalline tunnel junction layer $\mu n$ having a thickness of about 50 Å to about 120 Å on said etched surface;
- a second p-i-n solar cell comprising a p-type doped layer $p_2$ on said microcrystalline tunnel junction layer $\mu n$, an active instrinic layer $i_2$ on said layer $p_2$, and an n-type doped layer $n_2$ on said layer $i_2$;
- a back plate on said layer $n_2$, said back plate comprising at least one material selected from the group consisting of aluminum, silver, metal, and other conductors; and
- said first p-i-n solar cell being connected to said second p-i-n solar cell with a microcrystalline tunnel junction comprising said layer $n_1$, said layer $\mu n$ on said plasma etched surface of said layer $n_1$, and said layer $p_2$ on said layer $\mu n$.

27. A photovoltaic device in accordance with claim 26, including
- a conducting oxide on a portion of said back plate, selected from the group consisting of tin oxide and zinc oxide, and wherein
- said negatively doped, microcrystalline tunnel junction $\mu n$ layer has a thickness of about about 80 Å to about 100 Å on said etched surface.

28. A photovoltaic device in accordance with claim 26, wherein:
- at least one of the layers in one of said solar cells comprises hydrogenated amorphous silicon selected from the group consisting of amorphous hydrogenated silicon carbon, amorphous hydrogenated silicon germanium, and amorphous hydrogenated silicon; and
- said microcrystalline tunnel junction layer comprises a microcrystalline silicon layer selected from the group consisting of microcrystalline silicon carbon, microcrystalline silicon germanium, and microcrystalline silicon.

29. A photovoltaic device in accordance with claim 26, wherein:
- said layer $n_1$ comprises n-doped amorphous silicon; and
- said microcrystalline tunnel junction layer $\mu n$ comprises n-doped microcrystalline silicon.

30. A photovoltaic device in accordance with claim 26, wherein: said microcrystalline tunnel junction layer comprises a composite microcrystalline tunnel junction layer, said composite microcrystalline tunnel junction layer comprising said microcrystalline tunnel junction layer $\mu n$ and a microcrystalline tunnel junction layer $\mu p$, said microcrystalline tunnel junction layer $\mu n$ being positioned between said layer $n_1$ and said microcrystalline tunnel junction layer $\mu p$, and said microcrystalline tunnel junction layer $\mu p$ being positioned between said layer $\mu n$ and said layer $p_2$.

31. A photovoltaic device in accordance with claim 30, wherein:
- said layer $n_1$ comprises n-doped amorphous silicon;
- said microcrystalline tunnel junction layer $\mu n$ comprises n-doped microcrystalline silicon;
- said microcrystalline tunnel junction layer $\mu p$ comprises p-doped microcrystalline silicon; and
- said layer $p_2$ comprises p-doped amorphous silicon.

32. A process of producing a solar cell, comprising the steps of:
- forming solar cell semiconductor layers by plasma enhanced chemical vapor deposition with a feedstock diluted by a diluent, said solar cells comprising a doped layer having one conductivity, an active intrinsic layer, and a doped layer having an opposite conductivity;
- plasma etching a surface of one of said doped layers with said diluent in the absence of said feedstock; and
- nucleating and growing a layer of microcrystalline semiconductor material on said plasma etched layer.

33. A process in according with claim 32 wherein said plasma etched layer comprises an amorphous hydrogenated material selected from the group consisting of amorphous hydrogenated silicon, amorphous hydrogenated silicon carbon, and amorphous hydrogenated silicon germanium; and
- said microcrystalline material is selected from the group consisting of microcrystalline silicon, microcrystalline silicon carbon, and microcrystalline silicon germanium.

34. A process in accordance with claim 32, wherein one of said doped layers comprises said microcrystalline material.

35. A process in accordance with claim 32, including a tunnel junction layer grown on one of said doped layers, said tunnel junction layer comprising said microcrystalline layer.

36. A process in accordance with claim 32, wherein said nucleating and growing comprise:
- plasma enhanced chemical vapor deposition with a dopant and a feedstock diluted with a diluent;
- said dopant being selected from the group consisting of an n-type dopand and a p-type dopant, said n-type dopant being selected from the group consisting of phosphine ($PH_1$) and other phosphorous-containing compounds, said p-type dopant being selected from the group consisting of diborane ($B_2H_6$), $BF_3$, and other boron-containing compounds;
- said feedstock being selected from the group consisting of silane, disilane, tetramethyl silane, $SiF_4$, $SiHF_3$, $SiH_2Cl_4$, $CH_N(SiH_3)_{4-N}$ wherein N is an integer in the range of 0 to 3, a carbon based feedstock, a germanium based feedstock, and compounds having the general formula $Si_NH_{2N+2-M}Y_M$ wherein:
  Si=silicon H=hydrogen or deuterium
Y=a halogen
N=positive integer≧1
M=positive integer; and
2N+2−M≧0 said diluent being selected from the group consisting of hydrogen, deuterium, and combinations thereof; and the dilution ratio of said diluent to said feedstock ranges from about 50:1 to about 200:1.

37. A process in accordance with claim 32, wherein said plasma enhanced chemical vapor deposition is selected from the group consisting of: cathodic DC glow discharge, anodic DC glow discharge, RF glow discharge, VHF glow discharge, AC glow discharge, and microwave glow discharge.

38. A process for producing photovoltaic devices, comprising the steps of:

forming solar cell semiconductor layers on a substrate by plasma enhanced CVD with a feedstock diluted by a diluent, said solar cell comprising a p-type doped layer, an active intrinsic amorphous i-layer, and an n-type doped layer;

plasma etching a surface portion of said amorphous i-layer with an etchant selected from the group consisting of $H_2$, $D_2$, HD, helium, and argon, in the absence of said feedstock, for about 150 to about 750 seconds without damaging the optical and electrical properties of said i-layer, and after said plasma etching, nucleating and growing one of said doped layers adjacent said etched surface portion of said amorphous i-layer to form a microcrystalline doped layer having a thickness of about 50 Å to about 120 Å.

39. A process in accordance with claim 38, including forming tandem multi-junction solar cells with at least one microcrystalline doped layer.

40. A process in accordance with claim 38, wherein plasma enhanced chemical vapor deposition of said microcrystalline layer comprises direct current or radio frequency glow discharge under the following conditions:

the temperature of said substrate ranging from about 80° C. to about 300° C.;

the pressure ranging from about 0.5 to about 5 Torr; and the power density ranging from about 50 to about 230 mW/cm$^2$.

41. A process in accordance with claim 38, wherein:

said i-layer is selected from the group consisting of amorphous hydrogenated silicon, amorphous hydrogenated silicon carbon, and amorphous hydrogenated silicon germanium; and said microcrystalline layer is selected from the group consisting of microcrystalline silicon, microcrystalline silicon carbon, and microcrystalline silicon germanium.

42. A process in accordance with claim 38, wherein said i-layer is amorphous silicon;

said surface of said amorphous silicon i-layer is plasma etched for a period of about 300 to about 500 seconds with a hydrogen etchant; and said n-type doped layer is nucleated and grown to form an n-type microcrystalline silicon layer having a thickness of about 80 Å to about 100 Å.

43. A photovoltaic device, comprising:

at least one solar cell having a p-type doped layer, an intrinsic amorphous i-layer, and an n-type doped layer, said i-layer having a plasma etched surface; and one of said doped layers comprises a microcrystalline doped layer positioned adjacent and abutting said plasma etched surface of the i-layer.

44. A photovoltaic device in accordance with claim 43, wherein said microcrystalline doped layer has a thickness of about 50 Å to about 120 Å.

45. A photovoltaic device in accordance with claim 43, wherein said etched surface comprises a surface etched in a hydrogen plasma in the absence of silane, said etched surface having solar cell-grade optical and electrically properties.

46. A photovoltaic device in accordance with claim 43, wherein:

said i-layer is selected from the group consisting of amorphous hydrogenated silicon, amorphous hydrogenated silicon carbon, and amorphous hydrogenated silicon germanium; and said microcrystalline layer is selected from the group consisting of microcrystalline silicon, microcrystalline carbon, and microcrystalline silicon germanium.

47. A photovoltaic device in accordance with claim 43, comprising:

a substrate selected from the group consisting of a glass substrate, a stainless steel substrate, and a metal substrate; and a conductive oxide on said substrate, said conducting oxide selected from the group consisting of tin oxide and zinc oxide.

48. A photovoltaic device in accordance with claim 43, wherein:

said i-layer comprises amorphous silicon, and said n-type doped layer comprises an n-type microcrystalline silicon layer having a thickness of about 80 Å to about 100 Å.

49. A photovoltaic device in accordance with claim 48, wherein:

said solar cell is disposed on a light transmissive vitreous substrate selected from the group consisting of transparent glass and translucent glass, said substrate having a surface portion; and a conducting oxide is disposed on said surface portion, said conducting oxide being selected from the group consisting of tin oxide and zinc oxide.

50. A photovoltaic device in accordance with claim 43 comprising multi-junction tandem solar cells with at least one p-i-n solar cell, at least one i-layer comprising amorphous silicon with a hydrogen plasma etched surface, and at least one doped layer comprising an n-type microcrystalline silicon layer having a thickness of about 80 Å to about 100 Å.

* * * * *

UNITED STATES PATENT AND TRADEMARK OFFICE
CERTIFICATE OF CORRECTION

PATENT NO.: 5,730,808
DATED: March 24, 1998
INVENTOR(S): Liyou Yang, Liangfan Chen It is certified that error appears in the above-identified patent and that said Letters Patent is hereby corrected as shown below:

Patent reads:

| Col. | Line | |
|---|---|---|
| 3 | 53 | reads "photocarriers near the runnel junction" should read --photocarriers near the tunnel junction-- |
| 5 | 26 | reads "In another embodiment, a runnel junction layer" should read --in another embodiment, a tunnel junction layer-- |
| 5 | 27 | reads "the doped layers and the runnel junction layer" should read --the doped layers and the tunnel junction layer-- |
| 5 | 32 | reads "microcrystalline runnel junction layer between" should read --microcrystalline tunnel junction layer between-- |
| 5 | 45 | reads "Desirably, the runnel junction layer is fabricated" should read --Desirably, the tunnel junction layer is fabricated-- |

UNITED STATES PATENT AND TRADEMARK OFFICE
CERTIFICATE OF CORRECTION

PATENT NO.: 5,730,808

DATED: March 24, 1998

INVENTOR(S): Liyou Yang, Liangfan Chen

It is certified that error appears in the above-identified patent and that said Letters Patent is hereby corrected as shown below:

Patent reads:

| Col. | Line | |
|---|---|---|
| 5 | 55 | reads "hydrogen etching alone by DO or RF plasma" should read --hydrogen etching alone by DC or RF plasma-- |
| 6 | 54 | reads "to the n-type microcrystalline runnel junction layer" should read --to the n-type microcrystalline tunnel junction layer-- |
| 8 | 32 | reads "the negatively doped, microcrystalline runnel junction" should read --the negatively doped, microcrystalline tunnel junction-- |
| 8 | 43 | reads "the positively doped microcrystalline runnel junction μp layer" should read --the positively doped microcrystalline tunnel junction μp layer-- |
| 9 | 21 | reads "the microcrystalline runnel junction layer" should read --the microcrystalline tunnel junction layer-- |

UNITED STATES PATENT AND TRADEMARK OFFICE
CERTIFICATE OF CORRECTION

PATENT NO.: 5,730,808

DATED: March 24, 1998

INVENTOR(S): Liyou Yang, Liangfan Chen

It is certified that error appears in the above-identified patent and that said Letters Patent is hereby corrected as shown below:

Patent reads:

| Col. | Line | |
|---|---|---|
| 9 | 29 | reads "runnel junction μp layer"<br>should read --tunnel junction μp layer-- |
| 9 | 36 | reads "a traditional runnel junction"<br>should read --a traditional tunnel junction-- |
| 9 | 41 | reads "except for the runnel junction"<br>should read --except for the tunnel junction-- |
| 9 | 41 | reads "The Mayer thicknesses for the two junctions"<br>should read "The i-layer thicknesses for the two junctions-- |
| 9 | 43 | reads "runnel junction improved open circuit voltage"<br>should read --tunnel junction improved open circuit voltage-- |

UNITED STATES PATENT AND TRADEMARK OFFICE
CERTIFICATE OF CORRECTION

PATENT NO.: 5,730,808

DATED: March 24, 1998

INVENTOR(S): Liyou Yang, Liangfan Chen

It is certified that error appears in the above-identified patent and that said Letters Patent is hereby corrected as shown below:

Patent reads:

| Col. | Line | |
|---|---|---|
| 11 | 20 | reads "or microcrystalline runnel junctions" should read --or microcrystalline tunnel junctions-- |
| 13 | 63 | reads "(N=$_1$, M=4, Y=fluorine)" should read --(N=1, M=4, Y=fluorine)-- |
| 15 | 65 | reads "said microcrystalline runnel junction layer" should read --said microcrystalline tunnel junction layer-- |

UNITED STATES PATENT AND TRADEMARK OFFICE
CERTIFICATE OF CORRECTION

PATENT NO.: 5,730,808

DATED: March 24, 1998

INVENTOR(S): Liyou Yang, Liangfan Chen

It is certified that error appears in the above-identified patent and that said Letters Patent is hereby corrected as shown below:

Patent reads:

| Col. | Line | |
|---|---|---|
| 17 | 38 | reads "tetramethyl silane, $SiF_4$, $SiHF_2$" should read --tetramethyl silane, $SiF_4$, $SiHF_3$-- |
| 17 | 56 | should read ----the group consisting of diborane ($B_2II_6$) ---- |
| 18 | 52 | reads "wherein said runnel junction" should read --wherein said tunnel junction-- |
| 20 | 55 | reads "n-type dopand and a p-type dopant" should read --n-type dopant and a p-type dopant-- |

Signed and Sealed this

Nineteenth Day of January, 1999

Attest:

Attesting Officer

*Acting Commissioner of Patents and Trademarks*